(12) United States Patent
Sasov

(10) Patent No.: US 6,219,240 B1
(45) Date of Patent: Apr. 17, 2001

(54) THREE-DIMENSIONAL ELECTRONIC MODULE AND A METHOD OF ITS FABRICATION AND REPAIR

(75) Inventor: Yuriy Dmitrievich Sasov, Moscow (RU)

(73) Assignee: R-Amtech International, Inc., Bellevue, WA (US)

( * ) Notice: Subject to any disclaimer, the term of this patent is extended or adjusted under 35 U.S.C. 154(b) by 0 days.

(21) Appl. No.: 09/327,950

(22) Filed: Jun. 9, 1999

(30) Foreign Application Priority Data

Jul. 2, 1998 (RU) .................................. 98111997

(51) Int. Cl.[7] ..................................................... H05K 7/20

(52) U.S. Cl. ......................... 361/704; 174/16.3; 361/715; 361/735; 361/744; 361/720

(58) Field of Search ................................. 165/80.2, 80.3, 165/185; 176/16.3, 252; 257/685–686, 696, 767, 713; 361/690, 704, 707, 715, 719–721, 735, 744, 749, 752, 790, 772, 783, 796

(56) References Cited

U.S. PATENT DOCUMENTS

| | | |
|---|---|---|
| 3,348,101 | 10/1967 | Klein et al. . |
| 3,396,459 | 8/1968 | Freehauf et al. . |
| 3,505,570 | 4/1970 | Sprude et al. . |
| 3,725,744 | 4/1973 | Reed . |
| 4,103,318 | * 7/1978 | Schwede .............. 361/707 |
| 4,581,679 | 4/1986 | Smolley . |
| 4,587,594 | 5/1986 | McPherson . |
| 4,868,712 | 9/1989 | Woodman . |
| 4,930,045 | 5/1990 | Carlson et al. . |
| 4,953,058 | * 8/1990 | Harris ..................... 361/690 |
| 5,016,138 | 5/1991 | Woodman . |

(List continued on next page.)

FOREIGN PATENT DOCUMENTS

| | | |
|---|---|---|
| 1 202 362 | 10/1965 | (DE) . |
| 25 52 682 A1 | 6/1977 | (DE) . |
| 38 13 396 A1 | 11/1989 | (DE) . |
| 43 10 446 C1 | 5/1994 | (DE) . |
| 196 00 617 A1 | 7/1997 | (DE) . |
| 197 25 424 A1 | 1/1998 | (DE) . |
| 0 495 629 A1 | 7/1992 | (EP) . |
| 0 793 407 A2 | 9/1997 | (EP) . |
| 1487033 | 6/1967 | (FR) . |
| 2 095 039 | 9/1982 | (GB) . |
| 1 167 774 | 7/1985 | (RU) . |

OTHER PUBLICATIONS

Sentence of Reference Manual of Radio–Electronics Apparatus Designer (Translated Portions are Highlighted), editor R.G. Varlamov, Moscow, "Sov. Radio", 1980, p. 105.

Primary Examiner—Gregory Thompson

(57) ABSTRACT

The invention relates to an area of electronic equipment assembly using packaged and unpackaged electronic components. The invention solves a problem of creating an all-purpose construction of three-dimensional electronic modules with the possibility of employing practically any kind of packaged and unpackaged electronic components, providing high packing density, effecting heat removal and allowing good accessibility for repair. This is provided due to the arrangement of both packaged and unpackaged components in three-dimensional space in combination with effective heat removal directly from heat emitting components. Use of corrugated commutation boards and ordinary tools allows repair of any alternative design of the module without dismounting other components. This constructive solution allows an increased packing density of electronic equipment by 2–10 times in comparison with conventional constructions and increases mean time between failures (MTBF). It is possible to use this construction at any radioelectronic enterprise without employing a new production process and incurring additional expenditures.

16 Claims, 6 Drawing Sheets

U.S. PATENT DOCUMENTS

| | | |
|---|---|---|
| 5,025,307 | 6/1991 | Ueda et al. . |
| 5,050,039 | 9/1991 | Edfors . |
| 5,117,282 | 5/1992 | Salatino . |
| 5,247,423 * | 9/1993 | Lin et al. .............................. 361/719 |
| 5,279,029 * | 1/1994 | Burns ...................................... 29/856 |
| 5,309,318 | 5/1994 | Beilstein, Jr. et al. . |
| 5,420,751 * | 5/1995 | Burns .................................. 361/707 |
| 5,446,620 * | 8/1995 | Burns et al. ......................... 361/704 |

* cited by examiner

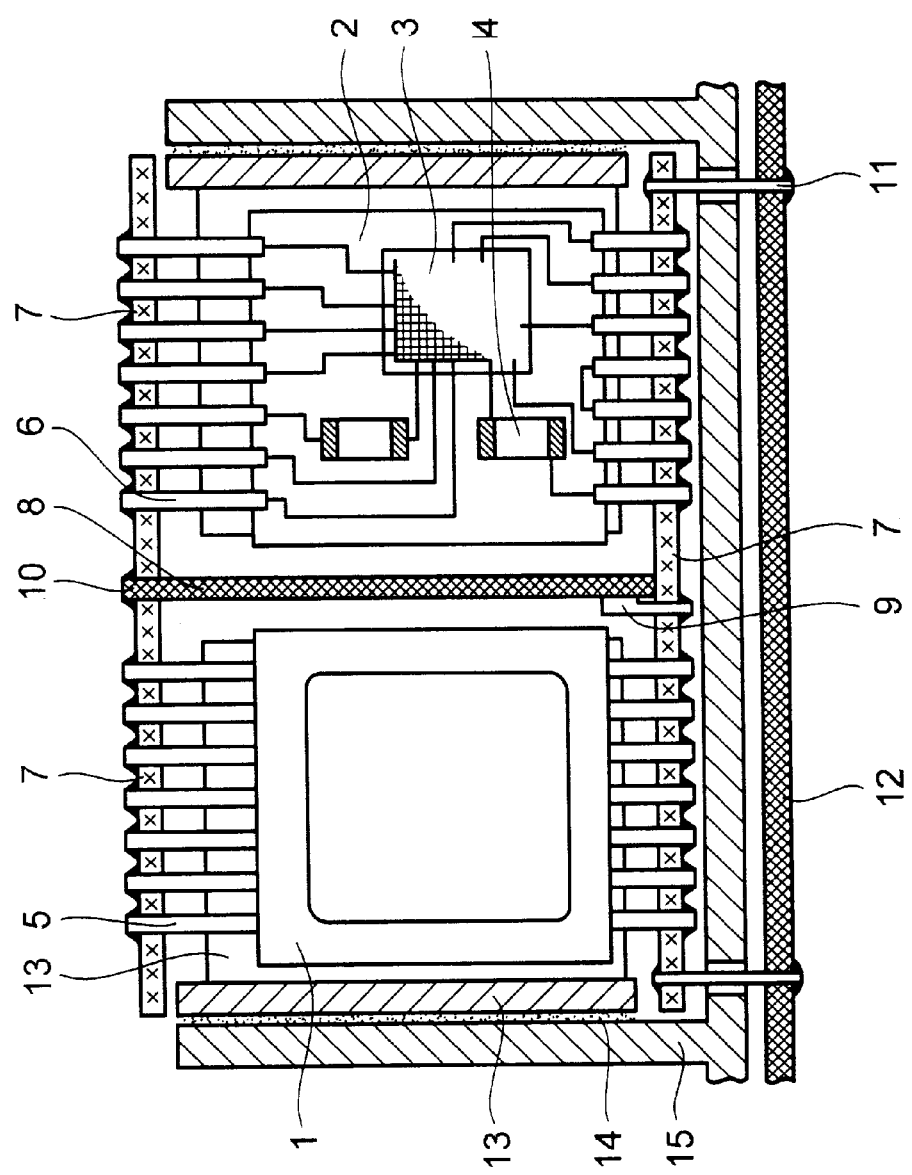

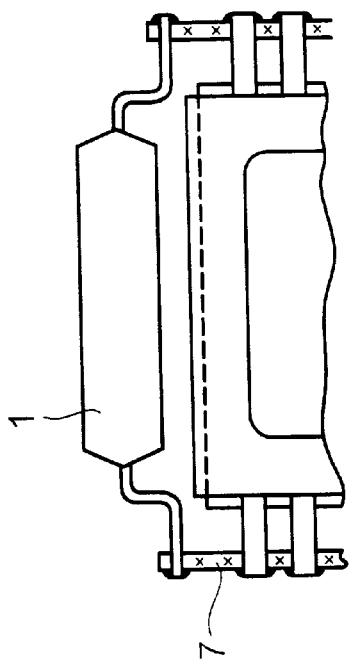
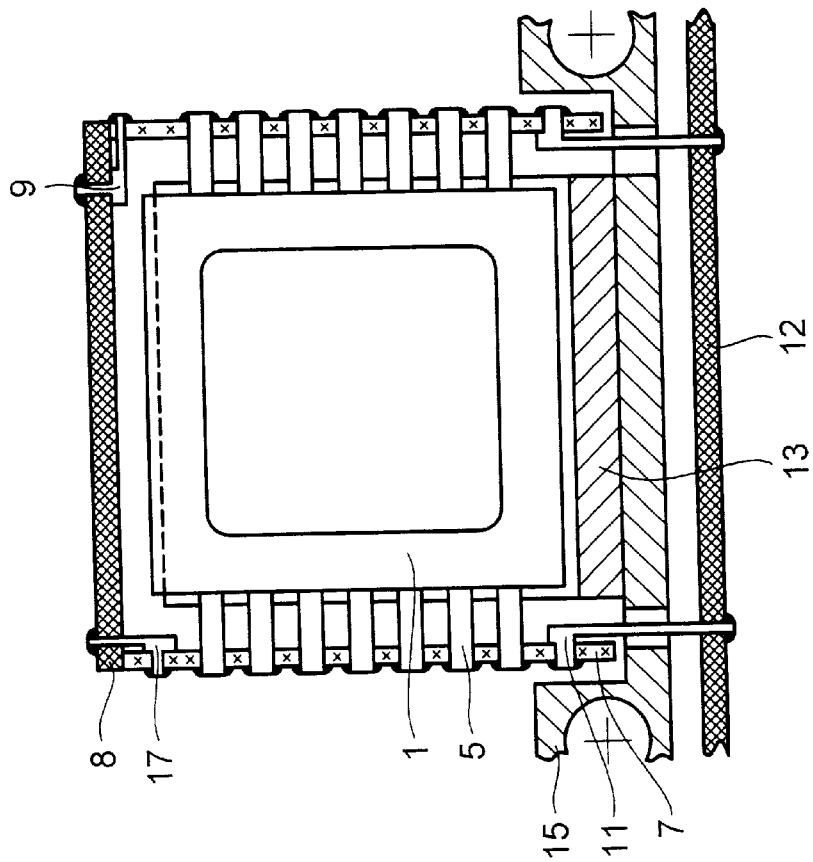
FIG. 2B
FIG. 2A

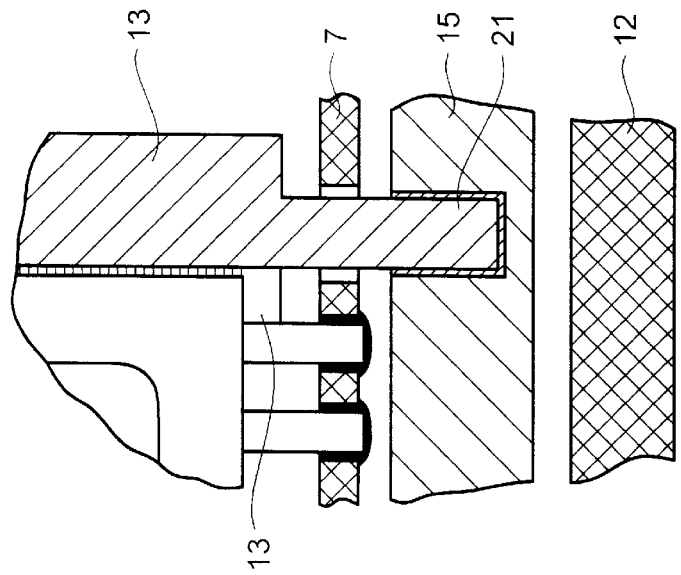
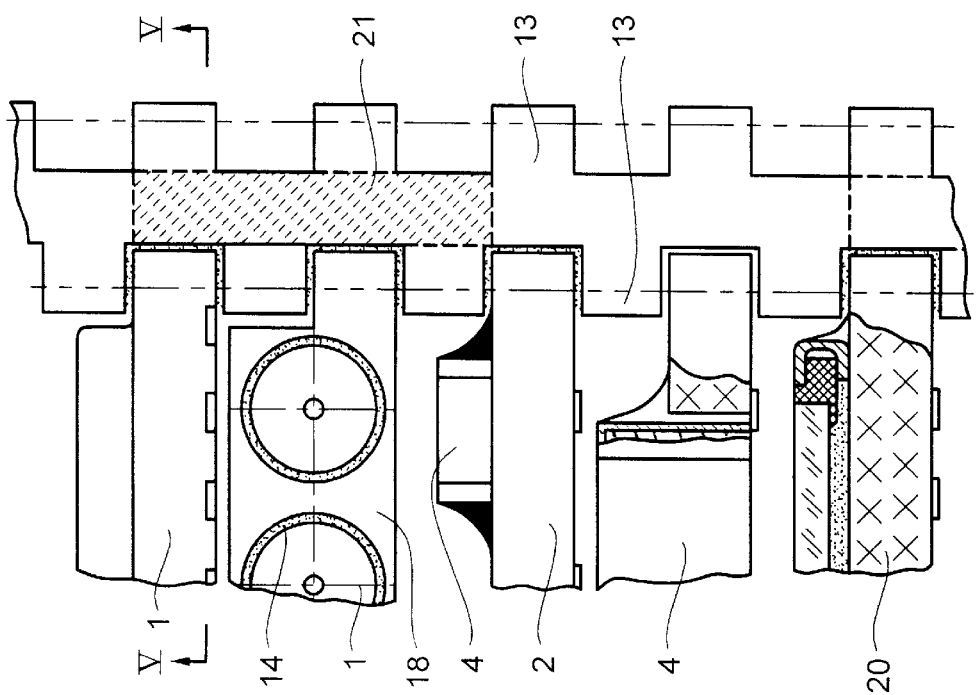
FIG. 5A
FIG. 5B

THREE-DIMENSIONAL ELECTRONIC MODULE AND A METHOD OF ITS FABRICATION AND REPAIR

BACKGROUND OF THE INVENTION

This invention relates to an area of electronic equipment assembling using packaged and unpackaged electronic components, and more particularly to a construction of a three-dimensional electronic module and a method of its fabrication and repair.

A known structural solution is disclosed in U.S. Pat. No. 3,725,744 HO5K 1/04 dated Nov. 6, 1971, "Connecting Assembly of Electronic Components".

An assembly for electric connection of different tiny electric components, one to another, comprises a flat surface, such as a motherboard, which holds the electric components, and at least one thin isolating ribbon, placed on a plane, disposed perpendicularly to the surface and having a plurality of apertures, disposed according to a preliminarily defined circuit pattern. A plurality of shared electroconductive pillars and at least one electroconductive bus are mounted on opposite sides of the isolating ribbon and are disposed transversally in order to pass through the apertures, according to the preliminarily defined pattern. In this case the selected beforehand pillars are welded to selected buses through the penetrated apertures and also are electrically connected to the different electric components according to the beforehand determined circuit pattern. It follows from the Patent description and FIG. 1, that the components are placed among the boards of modules, being parts of the assembly. Additionally the modules have electric contact with the motherboard through one of the board's side.

Advantages of this solution are the complex building the apparatus and obtaining a benefit from disposing the electronic components among the boards.

A shortcoming of this construction is a high labor-intensity of primary mounting electronic components and a complexity of extracting a failed component (it is necessary to unsolder a module and all the components at least from one board); also problems of heat removal are not solved.

Also known is a solution according to France Patent No. 1.487.033, dated May 22, 1967 for, "United Circuits Block and Method of Its Fabrication".

A packaged component is inserted into a flat board so, that its leads go to the board's grooves and end flush with the board's edge. The boards are assembled, forming three-dimensional module construction. Conductors, connecting components one to another, are deposited on borders of the module. The module is covered by a lid (at the top), and there is a board with external contacts at the bottom. All the boards are glued one to another, forming a monolithic construction.

This solution has all the advantages of three-dimensional assemblies, including allowing use of packaged components.

A shortcoming of this construction is the impossibility of dismounting it and the complexity of extracting a failed component. A problem of heat removal directly from a component is not solved.

A known technical solution is published in, "Reference Manual of Radio-Electronics Apparatus Designer", editor R. G. Varlamov, Moscow, "Sov.Radio", 1980), p.105, FIG. 5.4f.

Stacked modules having different heights are placed between parallel disposed commutation boards and have electrical and mechanical contact with them. The highest module determines the assembly's height while the rest of the modules have mechanical contact with one board and are electrically connected with the other board by leads with different lengths.

This solution is very schematic. In order to dismount and substitute for any failed module it is necessary to unsolder all modules from one of the boards. The again mounting of the board is also difficult, because it is necessary to insert simultaneously all module contacts into the unsoldered board. The problem of heat removal is not solved.

A known solution is described in A.C.SU 1167774 A HO5K 13/00 dated Jan. 21, 1983, "Method of Radioelements Mounting Between Adjacent Boards of Radio-Electronic Devices and Tool for Its Implementation".

According to this Author Certificate a method includes: disposing radioelements between mounting boards, shaping leads from one side of the radioelements and inserting the leads into mounting apertures of the boards (with preliminary shaping of the leads from one radioelement side being accomplished by bending them at right angles to a lead axis). During insertion of the leads into the mounting apertures of the boards the radioelements are disposed between the boards, shifted to one of the boards while inserting non-shaped radioelement leads into mounting apertures, the pre-shaped leads of the radioelement are unbent and the radio elements are shifted to the other board while inserting the unbent leads into the board's mounting apertures. A tool for mounting the radioelements between adjacent boards is a fork, formed by two pivots, mounted with a gap at a handle; additionally the pivots have flat surfaces, turned one to another, and a side surface of one of the pivots is conjugate with its flat surface by means of a cylindrical surface with variable curvature.

An advantage of this technical solution is the possibility of substituting a packaged component, disposed between two parallel hard commutation boards without dismounting the rest of the components of the module, and also of developing one of the repair tool constructions.

But there is neither a constructive solution of a three-dimensional module with components disposed between the boards, nor a sequence of module fabrication operations and constructive solutions concerning heat removal from heat emitting components, which significantly limits areas in which the invention can be applied.

A construction is known of an electronic devices package according to German Patent DE 3813396 A1 HO5K 5/02 dated Nov. 2, 1989. The package of electronic devices proposed, is characterized such that at least one wall of a device is a metal connecting plate, providing high mechanical strength and optimum heat removal.

An advantage of this construction is that it provides strength and heat removal from the electronic device.

Shortcomings of this invention include an absence of whole module construction and of module assembling and repair sequences.

A technical solution is also known according to U.S. Pat. No. 5,025,307 HO1L 39/02, dated Jun. 18, 1991, "Modular Semiconductor Device".

The modular semiconductor device comprises, as a rule, a couple of parallel circuit boards and a plurality of IC packages, mounted between the electronic circuit boards. Two or more modular semiconductor devices can be assembled, one on the other, so that a memory capacity can be easily increased, and a functional level can easily be raised. A heat emitting rib having a planar or comb structure can be provided in close contact with the IC package.

Advantages of this construction are obtained from disposing IC packages between circuit boards and also from the proposed variant of the heat sink comb construction. But variants of primary assembly of the modular device can be a very labor-consuming, and also possibilities of its repair are not disclosed in the Patent. Applying a gas as a cooling element makes the construction bulky and, practically, doesn't give any benefit in volume in comparison with conventional mounting methods.

A module's construction with a heat conductive wall is known according the U.S. Pat. No. 3,348,101, dated Oct. 17, 1967.

This is a high density module, comprising a heat conductive wall, including a rectangular flat plate having good heat conductivity and essentially straight edges, with assembling projections fastened along each of parallel edges of the flat plate. There are two printed circuit boards, each of them being mounted over one of the assembling projections and being flat-parallel to another board, the boards having printed circuits at least on one side and including notched edges. A plurality of electric components with leads, are mounted into the notched edges of the printed circuit boards, and the wall comprises an aperture and a flange for mounting an additional electric component, providing means for heat removal from this component.

Advantages of this construction include the possibility of applying different electronic components with comparatively simple primary assembly and repair and also a solving of the problem of heat removal from heat emitting components by placing them in the apertures of the heat removing fin.

A significant limitation is that component contacts are disposed only in one row at each side of heat conductive fin. This brings into doubt a soldering of component leads into the boards notches, from a reliability point of view. A general construction of the module for electronic devices arranging is not shown.

The closest solution to the invention of this patent application is that according the Author Certificate SU 1167774 A.

It is an object of this invention to create a universal construction of a three-dimensional electronic module with a possibility to apply packaged and unpackaged components, providing at the same time high packing density and effective heat removal and also maintaining a good reparability.

SUMMARY OF THE INVENTION

According to principles of this invention, a three-dimensional electronic module comprises mainly conventional packaged components and/or microboards with unpackaged active and passive components (sometimes referred to herein as wide circuit units), with the packaged components and the microboards having mainly double-sided lead arrangements and being disposed between parallel commutation boards of the module. The module further includes a heat sink and external leads. There is at least one connecting board positioned between parallel commutation boards with edge surfaces thereof facing the commutation boards and having electric and mechanical contact therewith; a heat removing comb partly envelopes a base of the component package or microboard and comprises, at least, one projection or plane having heat contact with an external heat removal system. Additionally, a base of each component package and/or microboard is made mainly of heat conductive materials.

In addition the packaged components can be disposed in grooves and apertures of a heat spreader, having heat contact with the heat conductive comb.

When assembling the packaged and/or unpackaged components, with their multi-row or matrix disposed leads, of the three-dimensional electronic module, it is advisable to mount these components preliminarily on a microboard with a double-sided, or edge, lead arrangement.

In order to provide reparability, at least one of the commutation boards can be a corrugated flexible printed circuit board. Additionally, dimensions of the corrugated flexible printed circuit board allow substitution of any failed packaged component or microboard without dismounting other packaged components or microboards that are part of the three-dimensional electronic module.

At least, one of the commutation or connecting boards can include external leads of the three-dimensional electronic module; the connecting board can also be a flexible cable or flexible printed circuit board.

In order to provide necessary stiffness to the structure and to increase possibilities of interconnections, at least one commutation board and/or connecting board is made as a hard printed circuit board, having a double-layer, or if it is necessary other multi-layer, conductors layout.

The connecting or commutation boards can have, at least, one metallized projection for electric and mechanical connection one to another.

In a possible variant of heat removal, when heating during operation, the packaged component has heat contact with a neighboring heat conductive package of an adjacent component, using it as a heat removing fin.

The raised problem is solved in a method of fabrication and repair of three-dimensional electronic modules, including printed circuit commutation boards with metallized apertures, in a manufacturing process involving cutting leads of packaged components and microboards to particular sizes, disposing the packaged components and/or microboards with unpackaged or packaged components between the commutation boards, making electric connection of the packaged components and/or microboards with the commutation boards. According the invention, during primary assembly of the module a layer of heat conductive grease is deposited in grooves or on a surface of the heat removing comb's fins, a first of the commutation boards is mechanically connected with the heat conductive comb, the packaged component or microboard is inserted into a groove of the heat removing comb and is lowered to the side of the first commutation board, the leads of the packaged component or the microboard are inserted into the metallized apertures of the first commutation board, the second commutation board is mounted and connected mechanically with the heat removing comb, free leads of the packaged components or the microboards are inserted into apertures of the second commutation board, keeping a necessary size of the leads going out from the second commutation board, the connecting board and/or flexible cable are mounted, and an electric mounting of all leads is conducted mainly using a method of group soldering.

During a primary assembling of the double row construction of the three-dimensional electronic module, first leads of packaged components or microboards are inserted into metallized apertures of the first commutation board, then the connecting board and the second commutation board are mounted, free leads of the packaged components or microboards are inserted into apertures of the second commutation board, keeping necessary size of the leads going out from the second commutation board, a layer of heat conductive grease is deposited into grooves or on a surface of heat removing combs' fins, the heat conductive combs are inserted into gaps between the packaged components and/or microboards, an electric contact of all packaged components and microboards is implemented mainly using group soldering.

During a three-dimensional electronic module repair, in order to extract a failed packaged component or microboard, all lengthened leads of the failed packaged component or the microboard are unsoldered by a group tool from one of the commutation boards, simultaneously these leads are bent and removed from the metallized apertures of the commutation board, further shortened leads, also using the group tool, are unsoldered from the other commutation board, the packaged component or the microboard is shifted into a gap between commutation boards and is extracted.

During a three-dimensional electronic module repair in a variant of a corrugated commutation board, leads of a failed packaged component or a microboard, facing the corrugated commutation board, are heated by a group tool to a temperature of solder melting, the corrugated part of the commutation board is raised, forming a necessary gap for the failed packaged component or microboard extraction, other leads of the packaged component or the microboard are also unsoldered with the group tool, the packaged component or the microboard is extracted. Additionally a mounting of a good packaged component or microboard is conducted in reverse order.

BRIEF DESCRIPTION OF THE DRAWINGS

The invention being proposed is explained below by concrete examples of its implementation and supplied figures. The described and drawn features can be used, individually or in preferred combinations, in other embodiments of the invention. The foregoing and other objects, features and advantages of the invention will be apparent from the following more particular description of a preferred embodiment of the invention, as illustrated in the accompanying drawings in which reference characters refer to the same parts throughout the different views. The drawings are not necessarily to scale, emphasis instead being placed upon illustrating principles of the invention in a clear manner.

FIGS. 1A and 1B are respectively fragmented, cross-sectional plan views of variants of a double-row three-dimensional electronic module according to the invention;

FIGS. 2A and 2B are respectively fragmented, cross-sectional views of variants of a single row three-dimensional electronic module according to the invention;

FIGS. 5A and 5B are fragmented, cross-sectional views of variants of structures for heat removal from components of a three-dimensional electronic module according to the invention, with FIG. 5B being taken on line V—V in FIG. 5A and rotated 90 degrees thereto.

DETAILED DESCRIPTION OF THE INVENTION

Figure 3:
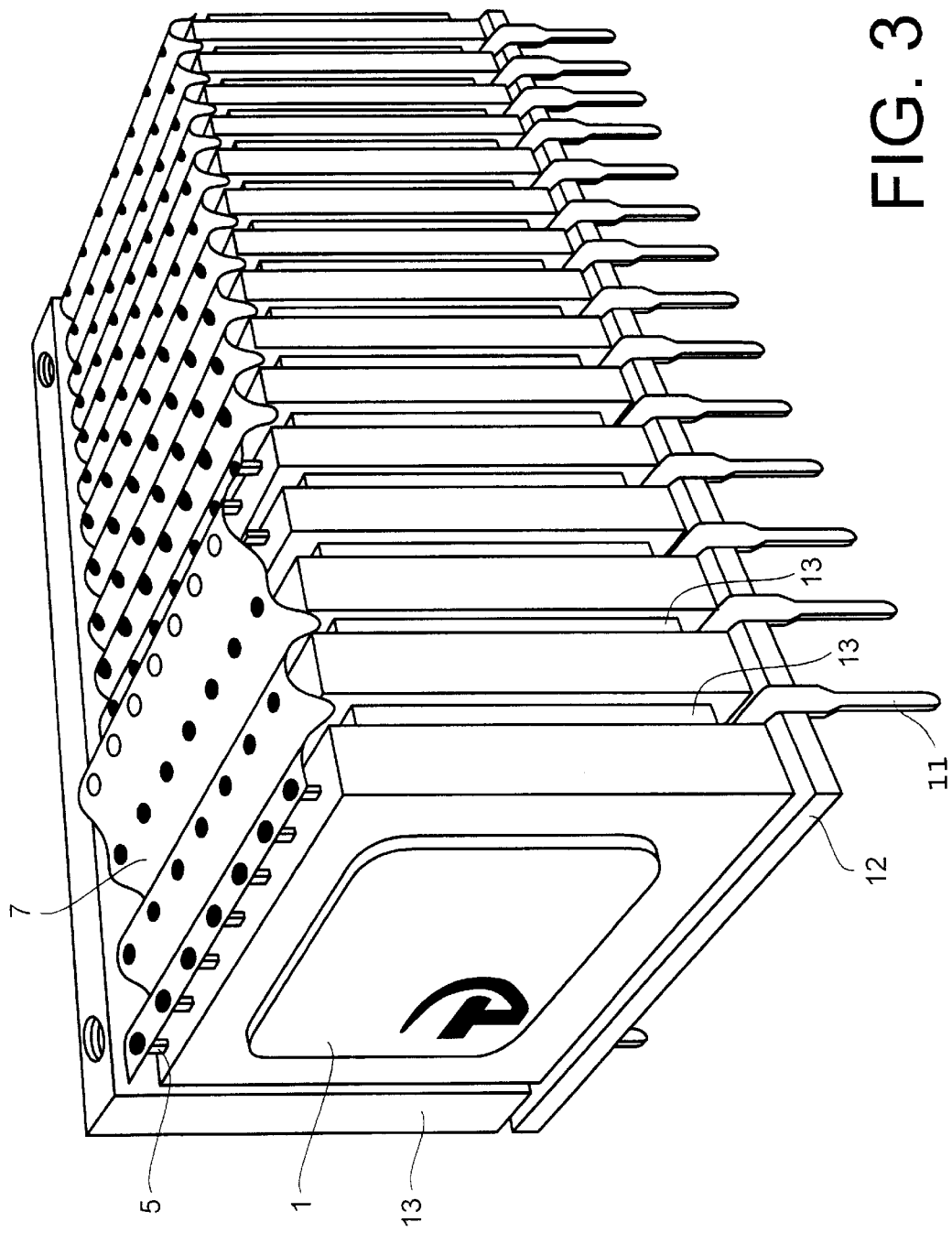
FIG. 3 is an isometric view of a construction of a three-dimensional electronic module with a corrugated commutation board according to the invention.

A proposed three-dimensional electronic module (FIG. 1A) in double row implementation comprises packaged components 1 and microboards 2 (sometimes referred to generally herein as wide circuit units) containing unpackaged active electronic components 3 and unpackaged passive electronic components 4. The packaged components 1 and the microboards 2 are connected through their respective leads 5 and 6, electrically and mechanically, with parallel disposed commutation boards 7. There is a connecting board 8 extending between the commutation boards, which is electrically and mechanically connected with the commutation boards 7 by leads 9 and/or by a metallized projection 10. At least one of the commutation boards 7 comprises external leads 11 of the three-dimensional electronic module, which are electrically connected with an external commutation board 12. A heat removing comb 13 is inserted into a gap between the packaged components 1 and/or microboards 2, which has heat contact with an external heat removing system 15 through a heat conductive grease 14. It is possible also, in a variant of construction, shown in FIG. 1B, for external leads 11 of the three-dimensional electronic module to be disposed on the connecting board 8, and to be, additionally, electrically connected with a commutation board 7 through a metallized projection 16 on the commutation board 7 or through a lead 17 of the commutation board 7. The commutation boards 7, connecting board 8, packaged components 1 and microboards 2, soldered to the commutation boards 7 by all the leads 5 and 6, in combination with the heat removing comb 13, create a mechanically rigid construction for the three-dimensional electronic module. Further, even assuming that the commutation boards 7 and the connecting board 8 are double-layer printed circuit boards, the structure shown in FIG. 1A, imitates a multi-layer printed circuit board, having its layers spread in space.

In a single row variant (FIG. 2A) it is possible to have external leads 11 of the three-dimensional electronic module on the commutation boards 7. In this case a connecting board 8 becomes external and it is electrically and mechanically connected with the commutation boards 7 by leads 17 or 9. This structure, accordingly, is decreased in size due to a reduction in size of an external heat removing system 15. FIG. 2B shows a variant, wherein functions of a connecting board 8 are fully or partly carried out by a packaged component 1. Repairs of structures of the three-dimensional modules of FIGS. 1A and 2A should be carried out using disclosures set out in A.C.SU 1167774 A.

A construction (FIG. 3) is proposed for providing reparability, maintaining all the advantages of three-dimensional assemblies, this structure has one commutation board 7, structured as a corrugated flexible printed circuit board. If it is necessary to substitute a failed packaged component 1 or a microboard 2, leads 5 or 6 correspondingly are unsoldered by a group method from the flexible commutation board 7, a part of the commutation board is raised, the lower leads 5 or 6 (according to FIG. 3) are unsoldered, the failed packaged component 1 or microboard 2 is extracted and a good component or microboard is substituted in reverse order. In this case it is not necessary to use any special tool, and it takes a few minutes to substitute a failed packaged component 1 or microboard 2.

Figure 4:
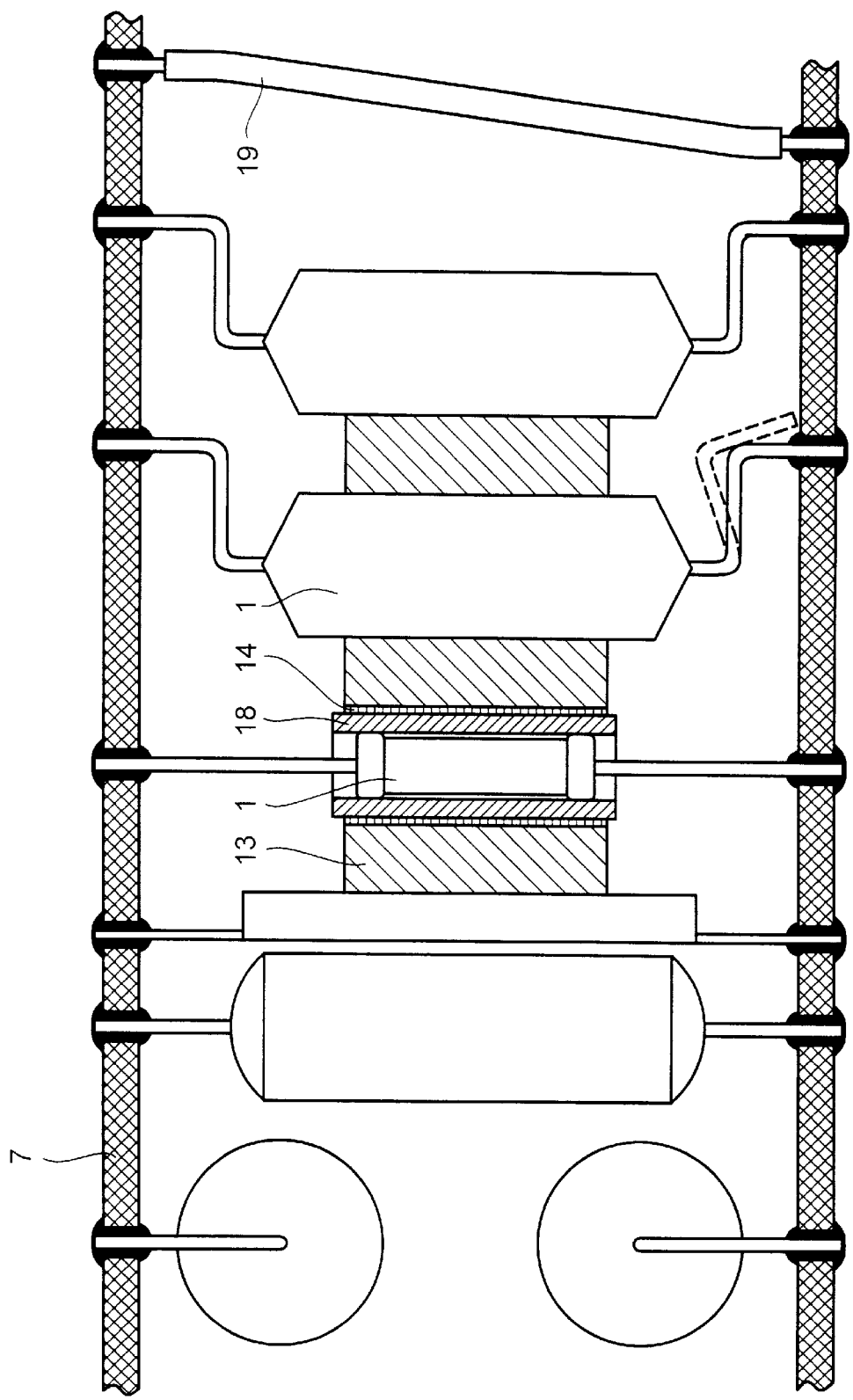
FIG. 4 is a fragmented, cross-sectional view of part of a three-dimensional electronic module using different components.

When using electronic components having different configurations (FIG. 4), it may be necessary to house some heat emitting packaged components 1 in a heat spreader 18, having heat contact with a heat removing comb 13 through heat conductive grease 14. FIG. 4 shows schematically a method of repair of the packaged components 1, housed in a conventional DIP package, and also a variant of mixed mounting, wherein it is advisable to mount a part of the packaged components 1 on a commutation board 7 using conventional methods. Further, it can be advisable to mount a connecting board 8 or, instead, a flexible cable 19 (it is possible for it to be a flexible printed circuit board), between the commutation boards 7. A flexibility of the cable simplifies its mounting and dismounting.

In order to increase a packing density of the three-dimensional electronic module's construction it is advisable to use a heat conductivity of the packaged components 1 and bases 20 of the microboards themselves (FIG. 5). In this variant the heat removing comb 13 only partly covers a package of the packaged component 1, heat spreader 18 and the base 20 of the microboard 2. Heat contact of the heat removing comb 13 with the external heat removal system 15 is implemented through a projection 21 on the comb. An equivalent thickness of the heat removing comb 13 is shown by a dot-dash line. Although this variant of construction is applicable mainly in cases of moderate heat emission, the heat removing comb 13 requires almost no additional space, which significantly increases the packing density. In this variant the heat removing comb 13 is disposed inside the three-dimensional electronic module, and, therefore, electric connections between the commutation boards 7 are advisable to be implemented using the flexible cable 19 (FIG. 4).

Figure 6C:
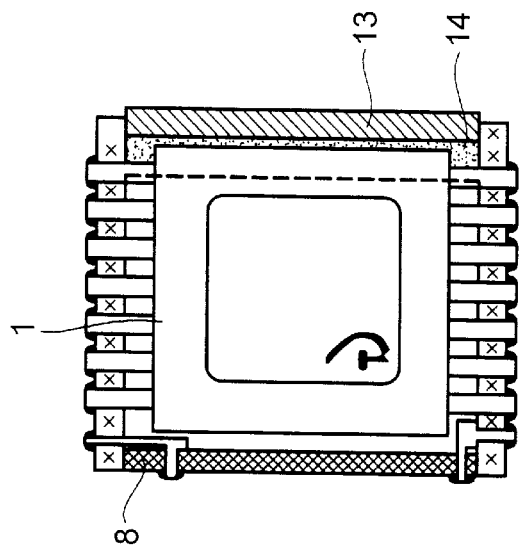
FIGS. 6A, 6B and 6C are fragmented, cross-sectional views showing operational sequences during a primary assembling of a three-dimensional electronic module according to the invention.
Figure 6B:
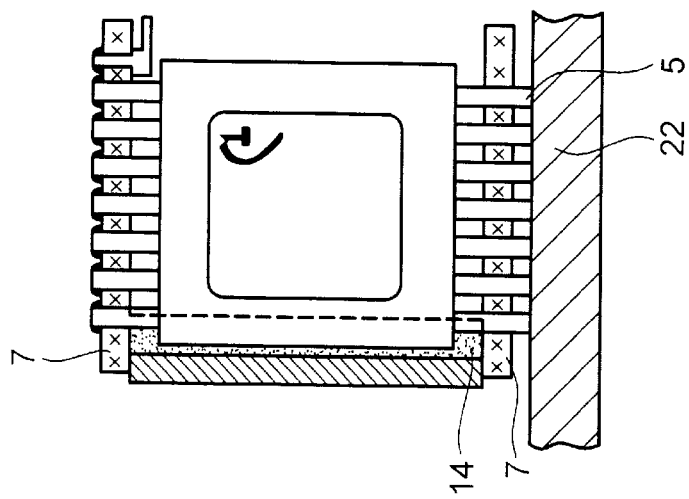
Figure 6A:
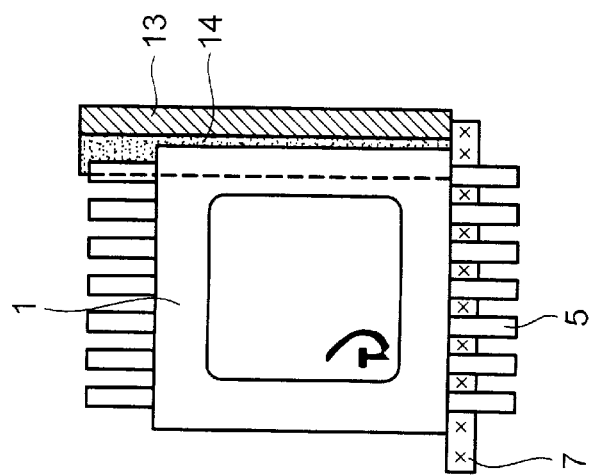

During a primary assembling of the three-dimensional electronic module (FIGS. 6A–C), a thin layer of the heat conductive grease 14 is deposited into grooves or on fins of the heat removing comb 13 and the heat removing comb 13 is mechanically connected to one of the commutation boards 7. The packaged components 1 or the microboards 2 are inserted into the grooves or between the fins of the heat removing comb 13, providing their heat contact with the comb 13 through the heat conductive grease 14; in addition, leads 5 of the packaged components 1 and leads 6 of the microboards 2 are inserted into metallized apertures of the commutation board 7 (FIG. 6a). Thereafter, the second commutation board 7 is mechanically connected with the heat removing comb 13 and leads 5 or 6 of a second row of the packaged components 1 or of the microboards 2 are inserted with a universal tool (for example, with pincers) into metallized apertures of the second commutation board 7. A lug 22 is used in this case, providing necessary leads going out from the commutation board 7 (FIG. 6b). Thereafter, the connecting board 8 is mounted and an electric mounting of the three-dimensional electronic module is carried out, using mainly a method of group soldering (FIG. 6c).

An analysis of fabricated prototypes constructed according to the present invention showed a reduction of volume by 2–10 times and an improved calculated reliability characteristic of about 2 times in comparison with apparatus fabricated using conventional constructions.

The proposed invention allows:

A Significantly reduced volume of electronic apparatus due to the disposition of electronic components in three-dimensional space;

Increased MTBF (Mean Time Between Failures) due to an effective heat removal directly from heated components;

Application in construction of practically all conventional packaged and unpackaged electronic components;

High reparability of electronic apparatus, implemented according to this construction;

Improved frequency responses of electronic apparatus due to a significant reduction of interconnection lengths;

Reduction or illumination of use of expensive and low-reliable multi-layer printed circuit boards;

Construction using operating industrial facilities at any radio-electronics enterprise quickly and without additional investments.

The invention can be applied:

1. For design and fabrication of powerful computers, using packaged and unpackaged electronic components in one and the same construction.
2. In ground systems of data detecting and processing in order to reduce a required square and physical volume of electronic apparatus by several times and to improve reliability.
3. In consumer and medical electronic techniques for implementation of broad-device nomenclatures with new, in principle, consumer properties,
4. In special purpose apparatus with high heat emissions and necessities to apply power packaged electronic devices.
5. In radionavigation and communication apparatus in order to apply cheap conventional components.
6. At any radio-electronic enterprise for creating electronic apparatus of new generations without mastering new technology processes and buying new industrial equipment.

REFERENCES

1. U.S. Pat. No. 3,725,744 H05K 1/04 dated Nov. 6, 1971, "Connecting Assembly of Electronic Components".
2. Patent of France No. 1.487.033, dated May 22, 1967, "United Circuits Block and Method of Its Fabrication".
3. "Reference Manual of Radio-Electronics Apparatus Designer", editor R. G. Varlamov, Moscow, "Sov.Radio", 1980, p.105, FIG. 5.4f.
4. A.C.SU 1167774 A H05K 13/00 dated Jan. 21, 1983, "Method of Radioelements Mounting Between Adjacent Boards of Radio-Electronic Devices and Tool for Its Implementation".
5. Patent of Germany DE 3813396 A1 H05K 5/02 dated Nov. 2, 1989.
6. U.S. Pat. No. 5,025,307 H01L 39/02, dated Jun. 18, 1991, "Modular Semiconductor Device".
7. U.S. Pat. No. 3,348,101, dated Oct. 17, 1967.

I claim:

1. Three-dimensional electronic module comprising
   parallel first and second commutation boards;
   at least two wide circuit units, chosen from packaged electronic components and microboards with unpackaged active and passive electronic components, each of said wide circuit units including a base with electronic components thereon and leads at side edges thereof, said wide circuit units being positioned between said parallel first and second commutation boards;
   a heat-removing comb for removing heat;
   at least one connecting board extending between said parallel first and second communication boards whose edge has electrical and mechanical contact with at least one of the first and second commutation boards;
   wherein each base of each wide circuit unit includes a heat conductive material, and said heat-removing comb extends between said at least two wide circuit units for partially covering each of said at least two wide circuit units and has at least one surface for being in heat contact with an external heat removing system.

2. Three-dimensional electronic module according to claim 1 wherein at least one wide circuit units comprises packaged components which are disposed in grooves of a heat sink having heat contact with the heat removing comb.

3. Three-dimensional electronic module according to claim 1 wherein at least one wide circuit unit is a microboard containing an electrical component with leads, disposed in two rows.

4. Three-dimensional electronic module according to claim 1 wherein at least one of the first and second commutation boards is made as a corrugated flexible printed circuit board (PCB), with dimensions of the corrugated flexible printed circuit board being sufficient for allowing substitution of failed wide circuit units.

5. Three-dimensional electronic module according to claim 1 wherein at least one of the commutation boards contains an external lead of the three-dimensional electronic module.

6. Three-dimensional electronic module according to claim 1 wherein the at least one connecting board contains an external lead of the three-dimensional electronic module.

7. Three-dimensional electronic module according to claim 1 wherein the at least one connecting board is made as one of a flexible cable or a flexible PCB.

8. Three-dimensional electronic module according to claim 1 wherein at least one of the commutation boards and connecting board is made as stiff PCB, having a multi-layer layout.

9. Three-dimensional electronic module according to claim 1 wherein the at least one connecting board has at least one metallized projection making electrical and mechanical connection with at least one of the first and second the commutation boards.

10. Three-dimensional electronic module according to claim 1 wherein at least one of the first and second commutation boards has at least one metallized projection for making electrical and mechanical connection with the at least one connecting board.

11. Three-dimensional electronic module according to claim 1, wherein at least one wide circuit unit has a heat conductive contact with a closely disposed heat conductive package of an adjacent wide circuit unit.

12. Method of fabricating the three-dimensional electronic module according to claim 1, comprising: manufacturing the first and second commutation boards as printed circuit boards with metallized apertures, arranging between the first and second commutation boards the wide circuit units, making electric connection of the wide circuit units with the first and second commutation boards wherein: during assemble a heat conductive grease is deposited on the heat removing comb, the first commutation board is mechanically connected with the heat removing comb, at least one wide circuit unit is inserted into a groove of the heat removing comb and moved toward a side of the first commutation board, leads of the at least one wide circuit unit are inserted into the metallized apertures of the first commutation board, a second commutation board is mechanically connected with the heat removing comb, an obtained assembly is turned over and free leads of the at least one wide circuit unit are inserted into apertures of the second commutation board, providing a necessary dimension of the leads extending from the second commutation board, the at least one connecting board is mounted, and electric contact of all the leads is made employing a method of group soldering.

13. Method of fabricating the three-dimensional electronic module according to claim 1 wherein: during assembly of the three-dimensional electronic module leads of at least one wide circuit unit is inserted into metallized apertures of the first commutation board, the at least one connecting board and the second commutation board are installed, an obtained assembly is turned over and free leads of the wide circuit units are inserted into apertures of the second commutation board, a necessary dimension of the leads extending from the second commutation board is provided, a coat of heat conductive grease is deposited on the heat removing comb, the heat removing comb is inserted into a gap between the wide circuit units, and electric contact of all the leads of the wide circuit unit is made mainly by a method of group soldering.

14. Method of repairing the three-dimensional electronic module according to claim 1 wherein: during repair, in order to remove a failed wide circuit unit, all lengthened leads of the failed wide circuit unit are unsoldered by a group tool from the first commutation board, at the same time these lengthened leads are bent and taken out of metallized apertures of the first commutation board, shortened leads are also unsoldered from the second commutation board, by means of a group tool the wide circuit unit is shifted into a gap between the first and second commutation boards and extracted out.

15. Method of repairing the three-dimensional electronic module according to claim 4 wherein: during repair leads of a failed wide circuit unit at the corrugated commutation board are warmed up by a group tool to a temperature of solder melting, a corrugated part of the corrugated commutation board is lifted, forming a gap, necessary for extracting the failed wide circuit unit, other leads of the packaged component or microboard are unsoldered from the other commutation board, the failed wide circuit unit is extracted, and a good wide circuit unit is mounted in reverse order.

16. Three-dimensional electronic module according to claim 1 wherein the portion of said heat-removing comb partially covering each of said at least two wide circuit units is in heat contact with said at least two wide circuit units.

* * * * *